United States Patent
Johnson et al.

(10) Patent No.: US 10,527,700 B2
(45) Date of Patent: *Jan. 7, 2020

(54) MULTIBAND, MULTISHOT MAGNETIC RESONANCE ELASTOGRAPHY

(71) Applicant: THE BOARD OF TRUSTEES OF THE UNIVERSITY OF ILLINOIS, Urbana, IL (US)

(72) Inventors: Curtis L. Johnson, Wilmington, DE (US); Bradley P. Sutton, Savoy, IL (US); Joseph L. Holtrop, Memphis, TN (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/787,462

(22) Filed: Oct. 18, 2017

(65) Prior Publication Data

US 2018/0106879 A1  Apr. 19, 2018

Related U.S. Application Data

(60) Provisional application No. 62/409,904, filed on Oct. 19, 2016.

(51) Int. Cl.
  *G01R 33/567*  (2006.01)
  *G01R 33/563*  (2006.01)
  *G01R 33/48*  (2006.01)
  *G01R 33/483*  (2006.01)
  *G01R 33/561*  (2006.01)

(52) U.S. Cl.
  CPC ...... *G01R 33/5673* (2013.01); *G01R 33/56358* (2013.01); *G01R 33/4826* (2013.01); *G01R 33/4835* (2013.01); *G01R 33/5611* (2013.01); *G01R 33/5676* (2013.01)

(58) Field of Classification Search
  None
  See application file for complete search history.

(56) References Cited

U.S. PATENT DOCUMENTS 5,245,282 A    9/1993  Mugler et al.
5,592,085 A    1/1997  Ehman
(Continued)

OTHER PUBLICATIONS

Braun, et al., "High-resolution mechanical imaging of the human brain by three-dimensional multifrequency magnetic resonance elastography at 7T", 2013, 7 pages.
(Continued)

*Primary Examiner* — Paresh H Patel
(74) *Attorney, Agent, or Firm* — Guntin & Gust, PLC; Robert Gingher (57) ABSTRACT

A method and system provides an acquisition scheme for generating magnetic resonance elastography displacement data with whole-sample coverage, high spatial resolution, and adequate SNR in a short scan time. The method and system can acquire in-plane and through-plane k-space shots over a volume of a sample divided into a plurality of slabs that each include a plurality of non-adjacent slices to obtain three dimensional multiband, multishot data, can apply multiband radio frequency refocusing pulses to the sample, can acquire navigators before readout, and can correct for non-linear motion errors.

20 Claims, 7 Drawing Sheets

(56) References Cited

U.S. PATENT DOCUMENTS

| | | | |
|---|---|---|---|
| 5,825,186 A | 10/1998 | Ehman et al. | |
| 5,977,770 A | 11/1999 | Ehman | |
| 6,185,447 B1 | 2/2001 | Alley et al. | |
| 6,879,155 B2 | 4/2005 | Ehman et al. | |
| 7,025,253 B2 | 4/2006 | Sinkus et al. | |
| 7,352,370 B2* | 4/2008 | Wang | A61N 5/103 345/424 |
| 8,290,565 B2 | 10/2012 | Ehman et al. | |
| 8,384,384 B2* | 2/2013 | Zhao | G01R 33/4824 324/309 |
| 8,508,229 B2 | 8/2013 | Ehman et al. | |
| 9,645,211 B2* | 5/2017 | Zhou | G01R 33/4824 |
| 2004/0041563 A1 | 3/2004 | Lewin et al. | |
| 2006/0012367 A1 | 1/2006 | Meaney et al. | |
| 2007/0182411 A1 | 8/2007 | Bammer et al. | |
| 2009/0105582 A1 | 4/2009 | Dougherty et al. | |
| 2011/0006767 A1 | 1/2011 | Sack et al. | |
| 2011/0270079 A1 | 11/2011 | Osman et al. | |
| 2012/0053450 A1 | 3/2012 | Salcudean et al. | |
| 2012/0269415 A1* | 10/2012 | Glaser | A61B 5/055 382/131 |
| 2012/0313641 A1 | 12/2012 | Labadie et al. | |
| 2013/0131490 A1 | 5/2013 | Huston, III et al. | |
| 2013/0181712 A1 | 7/2013 | Sutton et al. | |
| 2014/0107467 A1 | 4/2014 | Felmlee et al. | |
| 2014/0114177 A1* | 4/2014 | Chen | A61B 5/0051 600/415 |
| 2014/0159725 A1 | 6/2014 | Sack et al. | |
| 2014/0232395 A1 | 8/2014 | Sutton et al. | |
| 2014/0316245 A1 | 10/2014 | Romano et al. | |
| 2016/0266225 A1* | 9/2016 | Johnson | G01R 33/56358 |

OTHER PUBLICATIONS

Dai, et al., "Simultaneous Multislice Accelerated Interleaved EPI DWI Using Generalized Blipped-CAIPI Acquisition and 3D K-Space Reconstruction", 2017, 13 pages.

Glover, Gary, "Simple Analytic Spiral K-Space Algorithm", 1999, 4 pages.

Holtrop, et al., "Diffusion Weighted Imaging Using Multi-shot Spiral with a Simultaneous Multi-slice Excitation", 2015, 1 page.

Johnson, et al., "3D Multislab, Multishot Acquisition for Fast, Whole-Brain MR Elastography with High Signal-to-Noise Efficiency", 2014, 9 pages.

Johnson, et al., "Magnetic Resonance Elastography of the Brain Using Multishot Spiral Readouts with Self-Navigated Motion Correction", 2013, 9 pages.

Liu, et al., "Self-Navigated Interleaved Spiral (SNAILS): Application to High-Resolution Diffusion Tensor Imaging", 2004, 9 pages.

McGarry, et al., "An octahedral shear strain-based measure of SNR for 3D MR elastography", 2011, 13 pages.

McGarry, et al., "Multiresolution MR elastography using nonlinear inversion", 2012, 10 pages.

Murphy, et al., "Decreased Brain Stiffness in Alzheimer's Disease Determined by Magnetic Resonance Elastography", 2011, 5 pages.

Murphy, et al., "Preoperative assessment of meningioma stiffness using magnetic resonance elastography", 2013, 6 pages.

Muthupillai, et al., "Magnetic Resonance Elastrography by Direct Visualization of Propagating Acoustic Strain Waves", 1995, 5 pages.

Pruessmann, et al., "Advances in Sensitivity Encoding With Arbitrary k-Space Trajectories", 2001, 14 pages.

Streitberger, et al., "High-Resolution Mechanical Imaging of Glioblastoma by Multifrequency Magnetic Resonance Elastography", 2014, 9 pages.

Sutton, et al., "Fast, Iterative Image Reconstruction for MRI in the Presence of Field Inhomogeneities", 2003, 11 pages.

Won, Eric, "Optimized phase schedules for minimizing peak RF power in simultaneous multi-slice RF excitation pulses", 2012, 1 page.

Wuerfel, et al., "MR-elastography reveals degradation of tissue integrity in multiple sclerosis", 2010, 6 pages.

Zahneisen, et al., "Three-Dimensional Fourier Encoding of Simultaneously Excited Slices: Generalized Acquisition and Reconstruction Framework", 2014, 11 pages.

"International Preliminary Report on Patentability", PCT/US2014/050152, dated May 12, 2016, 7 pages.

Abolfathi, N. et al., "A Micromechanical Procedure for Modelling the Anisotropic Mechanical Properties of Brain White Matter", Computer Methods in Bomechanics and Biomedical Enginerring, vol. 12, No. 3, http://www.tandfonline.com/loi/gcmb20, Apr. 27, 2009, 249-242.

Anderson, AW et al., Analysis and Correction of Motion Artifacts in Diffusion Weighted Imaging. Magn Reson Med 1994;32:379-387.

Chatelin, S. et al., Fifty Years of Brain Tissue Mechanical Testing: From in Vitro to in Vivo Investigations. Biorheology 2010;47:255-276, Jun. 2010.

Clarkson, et al., A Comparison of Voxel and Surface Based Cortical Thickness Estimation Methods. NeuroImage 2011;57:856-865.

Di Ieva, A. et al., Magnetic Resonance Elastography: a General Overview of Its Current and Future Applications in Brain Imaging. Neurosurg Rev 2010;33:137-145.

Doyley, MM. et al., Thresholds for Detecting and Characterizing Focal Lesions Using Steady-State MR Elastography. Med Phys 2003;30:495-504.

Ehman, et al., Vibration Safety Limits for Magnetic Resonance Elastography. Phys Med Biol 2008;53:925-935.

Freimann, FB et al., Sack I. Alteration of Brain Viscoelasticity After Shunt Treatment in Normal Pressure Hydrocephalus. Neuroradiology 2012;54:189-196.

Glover, et al., Simple Analytic Spiral K-Space Algorithm. Magn Reson Med 1999;42:412-415.

Jenkinson, M. et al., A Global Optimisation Method for Robust Affine Registration of Brain Images. Med Image Anal 2001;5:143-156.

Johnson, C. L. et al., "Interleaved Spiral Sequence for MR Elastography of the Brain", University of Illinois at Urbana-Champaign, 2011, 1474.

Johnson, Curtis L., "Imaging the Local Mechanical Properties of the Brain With High-Resolution Magnetic Resonance Elastography", Dissertation for the degree of Doctor of Philosophy in Mechanical Engineering in the Graduate College of the University of Illinois at Urbana-Champaign, 2013, 137 pages.

Karampinos, DC et al., "High-Resolution Diffusion Tensor Imaging of the Human Pons with a Reduced Field-of-View, Multishot, Variable-Density, Spiral Acquisition at 3 T," Magn Reson Med 2009;62:1007-1016.

Kaster, et al., Measurement of the Hyperelastic Properties of Ex Vivo Brain Tissue Slices. J Biomech 2011;44:1158-1163, Jan. 2011.

Kim, D-H et al., Simple Analytic Variable Density Spiral Design. Magn Reson Med 2003;50:214-219.

Li, T. et al., High-Resolution Diffusion-Weighted Imaging with Interleaved Variable-Density Spiral Acquisitions. J Magn Reson Imaging 2005;21:468-475.

Liu, et al., Self-Navigated Interleaved Spiral (SNAILS): Application to High-Resolution Diffusion Tensor Imaging. Magn Reson Med 2004;52:1388-1396.

Liu, G-R et al., Brain Magnetic Resonance Elastography on Healthy Volunteers: a Safety Study. Acta Radiol 2009;50:423-429.

Mariappan, et al., "Magnetic Resonance Elastography: a Review," Clin Anat 2010;23:497-511.

McGarry, MDJ et al., "An Octahedral Shear Strain-Based Measure of SNR for 3D MR Elastography," Phys Med Biol 2011;56:N153-N164, 2011, 13 pages.

Murphy, MC, Decreased Brain Stiffness in Alzheimer's Disease Determined by Magnetic Resonance Elastography. J Magn Reson Imaging 2011;34:494-498., 2011, 5 pages.

Muthupillai, R. et al., "Magnetic Resonance Elastography by Direct Visualization of Propagating Acoustic Strain Waves," Science 1995;269:1854-1857.

Normand, V. et al., New Insight Into Agarose Gel Mechanical Properties. Biomacromolecules 2000;1:730-738.

(56) References Cited

OTHER PUBLICATIONS

Papazoglou, et al., Multifrequency Inversion in Magnetic Resonance Elastography. Phys Med Biol 2012;57:2329-2346.
Pfefferbaum, Adolf et al., "Increased Brain White Matter Diffusivity in Normal Adult Aging: Relationship to Anisotropy and Partial Voluming," Magn Reson Med 2003;49:953-961.
Plewes, DB et al., An Inductive Method to Measure Mechanical Excitation Spectra for MRI Elastography. Concept Magn Reson B 2004;21B:32-39.
Prange, M. et al., Regional, Directional, and Age-Dependent Properties of the Brain Undergoing Large Deformation. J Biomech Eng-T ASME 2002;124:244-252.
Romano, A. et al., In Vivo Waveguide Elastography of White Matter Tracts in the Human Brain. Magn Reson Med 2012, doi: 10.1002/mrm.24141.
Rump, et al., Fractional Encoding of Harmonic Motions in MR Elastography. Magn Reson Med 2007;57:388-395.
Sack, I. et al., A Method for the Noninvasive and Spatially Resolved Observation of Phase Transitions in Gels. J Am Chem Soc 2001;123:11087-11088.
Schregel, K. et al., Demyelination Reduces Brain Parenchymal Stiffness Quantified in Vivo by Magnetic Resonance Elastography. P Natl Acad Sci USA 2012;109:6650-6655.
Sinkus, R. et al., High-Resolution Tensor MR Elastography for Breast Tumour Detection. Phys Med Biol 2000;45:1649-1664.
Smith, S.M. et al., Advances in Functional and Structural MR Image Analysis and Implementation as FSL. NeuroImage 2004;23:S208-S219.
Smith, SM, Fast Robust Automated Brain Extraction. Hum Brain Mapp 2002;17:143-155.
Streitberger, K-J et al., "Sack I. In Vivo Viscoelastic Properties of the Brain in Normal Pressure Hydrocephalus," NMR Biomed 2011;24:385-392.
Streitberger, K-J et al., Brain Viscoelasticity Alteration in Chronic-Progressive Multiple Sclerosis. PLoS One 2012;7:e29888.
Van, AT et al., K-Space and Image-Space Combination for Motion-Induced Phase-Error Correction in Self-Navigated Multicoil Multishot DWI. IEEE T Med Imaging 2009;28:1770-1780.
Van Dommelen, Jaw et al., "Mechanical Properties of Brain Tissue by Indentation: Interregional Variation," J Mech BehavBiomed 2010;3:158-166.
Van Houten, DVR et al., Subzone Based Magnetic Resonance Elastography Using a Rayleigh Damped Material Model. Med Phys 2011;38:1993-2004.
Van Houten, EEW et al., Three-Dimensional Subzone-Based Reconstruction Algorithm for MR Elastography. Magn Reson Med 2001;45:827-837.
Wang, H. et al., A Three-Dimensional Quality-Guided Phase Unwrapping for MR Elastography. Phys Med Biol 2011;56:3935-3952.
Wuerfel, J. et al., "MR-Elastography Reveals Degradation of Tissue Integrity in Multiple Sclerosis," NeuroImage 2010;49:2520-2525.
Yin, M. et al., "Assessment of Hepatic Fibrosis with Magnetic Resonance Elastography," Clin Gastroenterol H 2007;5:1207-1213.
Zhang, et al., Segmentation of Brain MR Images Through a Hidden Markov Random Field Model and the Expectation-Maximization Algorithm. IEEE T Med Imaging 2001;20:45-57.
Zhang, J. et al., Viscoelastic Properties of Human Cerebellum Using Magnetic Resonance Elastography. J Biomech 2011;44:1909-1913.

\* cited by examiner

MULTIBAND, MULTISHOT MAGNETIC RESONANCE ELASTOGRAPHY

CROSS-REFERENCE TO RELATED APPLICATIONS

This application claims the benefit of U.S. Provisional Patent Application Ser. No. 62/409,904 filed Oct. 19, 2016. The contents of the foregoing are hereby incorporated by reference into this application as if set forth herein in full.

STATEMENT REGARDING FEDERALLY SPONSORED RESEARCH OR DEVELOPMENT

This invention was made with government support under EB018230 and EB001981 awarded by National Institutes of Health. The government has certain rights in the invention.

FIELD OF THE DISCLOSURE

The subject disclosure relates to a method and system for performing multiband, multishot magnetic resonance elastography (MRE).

BACKGROUND OF THE DISCLOSURE

Magnetic resonance elastography is an imaging technique for estimating the stiffness of tissues non-invasively. Shear waves are generated via external mechanical actuation and imaged with a specially designed magnetic resonance pulse sequence. The resulting images are used to calculate the underlying properties of the tissue.

Brain tissue viscoelasticity measured with MRE has continually shown promise in assessing neurodegenerative conditions and intracranial tumors. To develop the ability of MRE methods to capture local property measures, many recent methodological advancements have focused on the pursuit of high-resolution viscoelastic maps through improved imaging techniques. The challenge in acquiring high-resolution MRE data rests in balancing total scan time, signal-to-noise ratio (SNR), and distortions from field inhomogeneity.

BRIEF DESCRIPTION OF THE DRAWINGS

Reference will now be made to the accompanying drawings, which are not necessarily drawn to scale, and wherein.

DETAILED DESCRIPTION OF THE DRAWINGS

The subject disclosure describes, among other things, illustrative embodiments for providing multiband, multishot MRE. In one or more embodiments, MRE can be utilized as a non-invasive technique, such as for measuring focal mechanical properties of tissue samples (e.g., brain tissue) in vivo.

The application of MRE to various samples can be beneficial. For instance, MRE can be utilized to study the brain where mechanical properties of brain parenchyma are very sensitive to neurological disease state. The exemplary embodiments can be used for distinguishing specific microstructural tissue characteristics through the mechanical properties. The exemplary embodiments enable local property estimation by specific neuroanatomical regions, including individual white matter tracts and lobes of the brain. Measuring local properties in relevant brain regions may improve the sensitivity and specificity of MRE measures in the investigation of neurological conditions.

The exemplary embodiments enable capturing full vector field shear wave propagation with high spatial resolution and SNR via the collection of a significant amount of imaging data in a single procedure. The exemplary embodiments can avoid imaging coverage in the slice direction being compromised due to scan time, and further avoids reduced spatial resolutions for whole brain imaging. The exemplary embodiments can provide for capturing of whole-brain displacement data at high resolution to investigate the local mechanical properties of structures throughout large portions of the central nervous system. Other embodiments are described in the subject disclosure.

One embodiment of the subject disclosure is a method of MRE. The method can include applying, by a system including a processor, a first multiband radio frequency (RF) excitation pulse to a sample, wherein the sample is divided into a plurality of slabs that each include a plurality of non-adjacent slices; applying, by the system, first and second motion encoding gradients and a multiband RF refocusing pulse to the sample, wherein the multiband RF refocusing pulse is applied after the first motion encoding gradient, and wherein the second motion encoding gradient is applied after the multiband RF refocusing pulse; acquiring, by the system, a blipped, spiral-in three dimensional navigator data; providing, by the system, a $k_z$ gradient blip to define a sample plane; acquiring, by the system, in-plane k-space data after the $k_z$ gradient blip is provided; and repeating the applying of the first multiband RF excitation pulses, the applying of the first and second motion encoding gradients and multiband RF refocusing pulses and the acquiring of the in-plane k-space data over the plurality of slabs to obtain three dimensional multiband, multishot data.

One embodiment of the subject disclosure includes a system having an actuator for applying a vibration to a sample, a magnetic resonance system for facilitating applying magnetic resonance elastography to the sample, a processor coupled with the actuator and the magnetic resonance system, and a memory that stores executable instructions. The processor, responsive to executing the instructions can facilitate performance of operations including applying first and second motion encoding gradients and a multiband RF signal pulse to the sample, wherein the multiband RF refocusing pulse is applied after the first motion encoding gradient, and wherein the second motion encoding gradient is applied after the multiband RF signal pulse; acquiring a blipped, spiral-in three dimensional navigator data; providing a $k_z$ gradient blip to define a sample plane; acquiring in-plane k-space data after the $k_z$ gradient blip is provided; and repeating the applying of the first and second motion encoding gradients and the acquiring of the in-plane k-space data over a plurality of slabs comprising non-adjacent slices to obtain three dimensional multiband, multishot data.

One embodiment of the subject disclosure includes a computer-readable storage device comprising computer instructions which, responsive to being executed by a processor, facilitate performance of operations, including applying a first multiband RF pulse to a sample that is divided into a plurality of slabs that each include a plurality of non-adjacent slices; applying first and second motion encoding gradients and a multiband RF refocusing pulse to the sample, wherein the first motion encoding gradient is applied before the first refocusing pulse, and wherein the second motion encoding gradient is applied after the first multiband RF refocusing pulse; acquiring a blipped, spiral-in three dimensional navigator data; providing a $k_z$ encoded gradient blip to define a sample plane; acquiring an in-plane k-space shot comprising a plurality of non-adjacent slices after the second motion encoding gradient is applied; and repeating the applying of the first multiband excitation pulse, the applying of the first and second motion encoding gradients and the multiband RF refocusing pulse and the acquiring of the spiral-in three dimensional navigator data and the in-plane k-space shot over the plurality of slabs of the sample to obtain three dimensional multiband, multishot data.

In one embodiment, a novel sequence for MRE of the brain based on multiband RF excitation and 3D encoding of the distributed slab with multishot spirals. This sequence allows access to optimal SNR efficiency and reduced distortions from field inhomogeneity, but also parallel imaging acceleration both in-plane and through-plane without onerous artifacts and g-factor penalties. Nonlinear motion-induced phase errors are corrected through a $k_z$-blipped spiral-in 3D navigator. The sequence captures whole-brain MRE data at 2×2×2 mm$^3$ resolution in 3 minutes, showing that proposed multiband sequence may quickly acquire high-resolution, high-SNR brain MRE displacement data. By enabling parallel imaging acceleration both in-plane and through-plane, a flexible sequence that can be used to improve the clinical adoption of high-resolution MRE methods or further push the bounds of achievable resolution.

Figure 1:
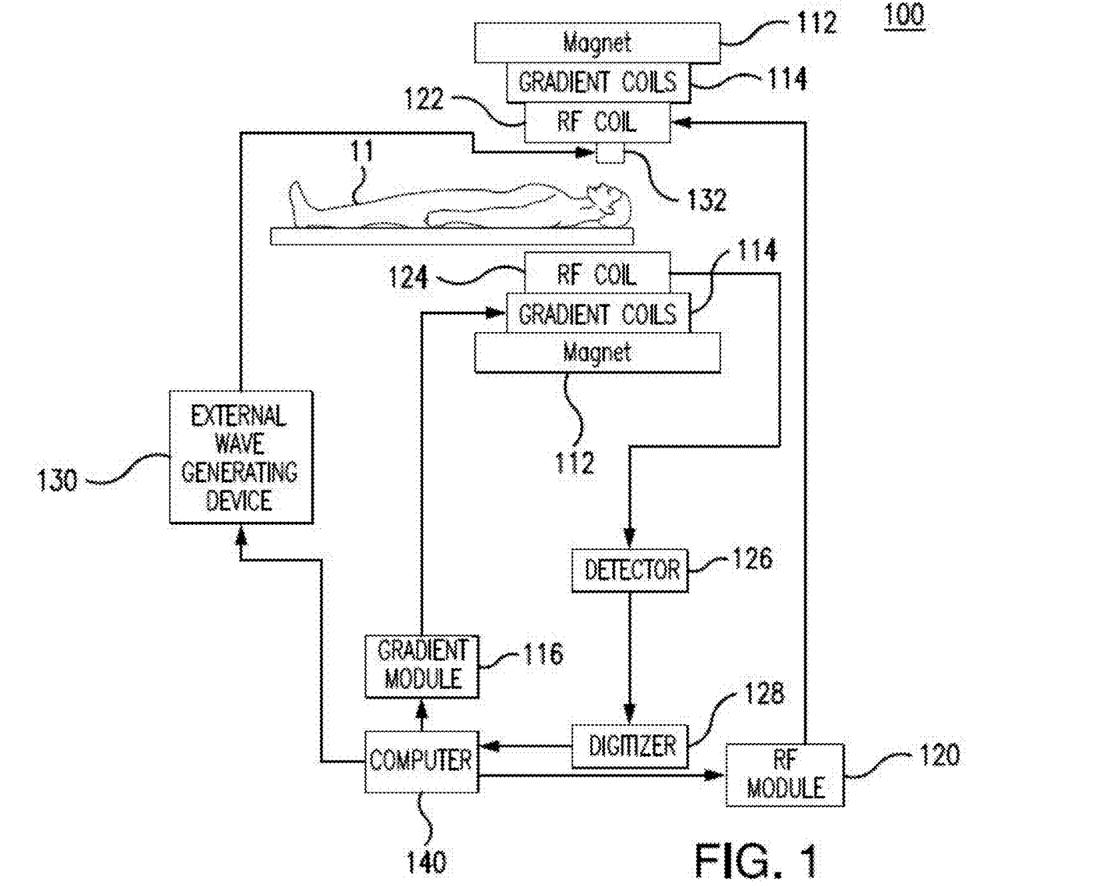
FIG. 1 depicts an illustrative embodiment of a system that performs multiband, multishot magnetic resonance elastography acquisition.

Referring to FIG. 1, a system 100 is illustrated that can be utilized for performing MRE, and in particular a multiband, multi shot MRE. FIG. 1 is a block diagram illustrating a system 100 for use in magnetic resonance imaging (MRI) of mechanically agitated tissue. In system 100, a magnet 112 creates a static base magnetic field in the patient tissue 11 to be imaged while the patient is positioned on a table. Within the magnet system are gradient coils 114 for producing position dependent magnetic field gradients superimposed on the static magnetic field. Gradient coils 114, in response to gradient signals supplied thereto by a gradient control module 116, produce position dependent and shimmed magnetic field gradients in three orthogonal directions and generates pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient tissue 11.

An RF module 120 provides RF pulse signals to an RF coil 122, which in response produces magnetic field pulses that excite the spins of the protons in the imaged body tissue. An external wave generator 130 generates mechanical waves for transmission through patient tissue 11 by a transducer 132 and a spatially selective gradient generator generates spatially selective magnetic fields for selection of a volume comprising an anatomical region of interest. Gradient control module 116 in conjunction with RF module 120 as directed by computer 140, control slice-selection, phase-encoding, readout gradient magnetic fields, radio frequency transmission, and magnetic resonance signal detection, to acquire magnetic resonance signals representing planar slices of patient tissue 11.

In response to applied RF pulse signals, RF coils 124 receive MRI signals, i.e., signals from the excited protons within the body as they return to an equilibrium position established by the static and gradient magnetic fields. The MRI signals are detected by a detector 126 (comprising a preamplifier and amplifier), the MRI signals are then filtered by an analog low-pass filter (the pass band of which is controlled directly or indirectly by the pulse sequence and computer 140), converted into digital signals by a digitizer 128 and provided to the computer 140. Alternatively, a digital filter may be used instead of, or in conjunction with, an analog low-pass filter. The MRI signals are detected and processed by a detector within RF module 120 to provide image representative data to an image data processor in computer 140.

Computer 140 includes a graphical user interface (GUI) enabling user interaction with the computer 140 via a user data entry device and enabling user modification of magnetic resonance imaging signals in substantially real time. Computer 140 uses information stored in an internal database to process the detected MRI signals in a coordinated manner to generate high quality images of a selected planar slice (or slices) of the body and adjust other parameters of system 100. Computer 140 similarly generates graphical representations of vector displacement fields in organs or tissues of the body, such as the brain or liver or muscle, in response to mechanical waves transmitted through patient anatomy. Displacement fields can also be measured in soft materials and other objects capable of being imaged in an MRI scanner. The resulting displacement fields are of sufficient quality for processing. The displacement fields represent a quantitative estimate of the shear modulus of the tissue. The stored information comprises predetermined pulse sequence and magnetic field gradient and strength data as well as data indicating timing, orientation and spatial volume of gradient magnetic fields to be applied in imaging, as explained in further detail below. Generated images and data are presented on a display.

MRI systems divide the total imaging volume into thin slices that are sampled with a 2D k-space. Since each slice can be excited sequentially in a single repetition time (TR), the slices can cover a volume without much penalty in time. When larger coverage is needed, the TR can be made longer to accommodate the increased number of slices. But increasing TR increases the total acquisition time, though without much increase in SNR as TR becomes much greater than the tissue T1-relaxation value:

$$SNR_{T_1} \propto 1 - 2e^{-\frac{(TR-TE/2)}{T_1}} + e^{-\frac{TR}{T_1}} \quad (1)$$

In whole-brain acquisitions with high-resolution, where many slices are needed for full coverage, this approach often results in TRs as long as 10 seconds. Since the $T_1$ of brain tissue is between 1 and 2 seconds, the extra time spent acquiring data with such a long TR provides minimal SNR benefit.

Instead of 2D slice sampling with long TRs, acquisitions can sample the entire volume with a 3D k-space. 3D sampling can utilize multiple excitations, $N_{ex}$, of the same imaging volume that contribute to the SNR of the acquisition:

$$SNR_{ex} \propto \sqrt{N_{ex}} \quad (2)$$

Large volumes for whole-brain coverage can use many excitations to achieve high resolution in the slice direction, though the volume may only be excited once per TR. This approach is slow as there may be a significant waiting period in each TR after the necessary gradients and RF pulses are applied. Minimizing this downtime and overcoming the resulting long acquisition time may require a very short TR, which decreases acquisition SNR from lack of sufficient $T_1$ recovery.

In any discussion of appropriate imaging volume and sampling strategy, it is useful to formulate the tradeoffs in TR and $N_{ex}$ in terms of SNR efficiency, $\eta_{SNR}$ defined as the ratio of SNR to the square root of total acquisition time (equal to $TR \cdot N_{ex}$) with the in-plane k-space trajectory fixed:

$$\eta_{SNR} \propto \frac{SNR_{T_1} \cdot SNR_{ex}}{\sqrt{TR \cdot N_{ex}}} \quad (3)$$

After substituting the expression from Eqs. (1) and (2), TR, TE, the tissue $T_1$ relaxation time value determines SNR efficiency:

$$\eta_{SNR} \propto \frac{1 - 2e^{-\frac{(TR-TE/2)}{T_1}} + e^{-\frac{TR}{T_1}}}{\sqrt{TR}} \quad (4)$$

SNR efficiency can be defined as the ratio of SNR to the square root of total acquisition time. For white matter and gray matter, which have $T_1$ values at 3T of 1084 and 1820 ms, maximum SNR efficiency occurs with TRs of approximately 1500 and 2400 ms, respectively. These optimal TRs can be calculated with an echo time (TE) typical of the MRE acquisition of 73 ms.

Maximizing SNR efficiency by choosing an optimal TR may not directly reduce the long scan times necessary for whole-brain coverage with high spatial resolution. However, the surplus of SNR afforded by the improved efficiency can allow for the use of fewer motion encoding time points and incorporation of parallel imaging to reduce acquisition time while maintaining an adequate SNR for MRE inversion.

System 100 enables a multiband, multishot acquisition for MRE that provides whole imaging coverage (e.g., a whole brain) and high spatial resolution. Multiband excitation results in a "distributed slab" imaging volume subsequently encoded with a 3D k-space comprising a stack of in-plane spiral readouts. Slabs are thick imaging volumes that are encoded in a 3D k space, such that reconstruction of the encoded volume produces multiple slices. The slab volumes can then be arranged to form a whole-brain imaging coverage, similar to traditional 2D encoding. By balancing the number of slabs, and number of slices per slab, SNR efficiency of the acquisition can be maximized. For every unit of time spent collecting data, the highest SNR can be achieved.

Multiple "distributed slabs," where slices in a slab are not adjacent (contiguous), overcomes a limitation of slab excitation. Namely the previous methodology had a limitation in the achievable slice excitation profiles that were a challenge to excite just a particular slab of interest. The slice excitation profile led to the signal degradation at the edge of thick slabs, and could also result in neighboring slabs interfering with one another. Such interference results in a "Venetian blind" artifact and requires oversampling to correct and remove artifacts. Using a distributed slab, with slices in each slab spaced apart, but excited simultaneously with a multiband RF excitation pulse, Venetian blind artifacts are overcome. Multiband RF pulses use thin, single width excitation profiles (just multiple stacked together). The multiple slices are reconstructed and the slice profile is not resolved, thus distributed slices do not have as severe profile issues. Using the distributed slabs then removes the Venetian blind artifact and removes the need for data oversampling in each slab. Consequently, data acquisition is accelerated while retaining the SNR efficiency benefits of multislab encoding.

In one embodiment invention, a multiband RF pulse excites multiple, non-adjacent slices comprising a 3D imaging slab volume for each shot. In one embodiment, four slices are simultaneously excited in each slab, for a MB factor=4. The protocol uses a TE of 75 ms and a TR of 1920 ms, which is still in the range of optimal SNR efficiency. To cover an entire brain volume with $2 \times 2 \times 2$ mm$^3$ voxel resolution, 15 interleaved consecutive slab volumes are acquired, for a total imaging coverage of 120 mm in 60 total slices. The total time for complete imaging was 2:53 with $2 \times 2 \times 2$ mm$^3$ resolution, and had a high octahedral shear strain-based SNR (OSS-SNR) value that indicates data quality and above the minimum threshold for inversion processing. Previous slab imaging acquired with contiguous slices achieving the same $2 \times 2 \times 2$ mm$^3$ resolution took 6 minutes to acquire data for an entire brain volume.

The distributed slab volume allows for greater parallel imaging acceleration without the onerous penalty from residual aliasing from parallel imaging by undersampling k-space both in-plane and through-plane. Parallel imaging acceleration allows greater access to speed, signal-to-noise ratio, and spatial resolution, and thus results in superior image quality. Parallel imaging is the recovery of the image from an under sampled k space data by means of using multiple receiver coils with varying spatial sensitivity profiles, thus accelerating the acquisition. Parallel imaging under sampling can be performed in any dimension where multiple coils are spaced out across the imaging volume. In one embodiment, multiple coils are arranged in the x direction, thus enabling undersampling in the $k_x$ data space. However, undersampling above a reduction factor of 3-4x will result in aliasing artifacts.

In 2D imaging, undersampling can only happen "in plane," as there is only a 2D k-space being sampled. In 3D multislab imaging, z undersampling is also theoretically possible, but the imaging volumes are too thin to "see" multiple coils spaced in the slice direction. With a "distributed" slab, the physical volume being imaged comprises a large spatial extent due to the non-contiguous slices, and thus enables the use of multiple coils in the z direction. This ultimately enables undersampling in the z direction, in addition to xy undersampling. In one embodiment, undersampling in both the z direction and the xy slice plane further accelerates data acquisition, thus resulting in a greater total reduction factor, R. As shown further below in connection with FIG. 3, different undersampling patterns demonstrate how well parallel imaging works in multiple directions.

Also included is a 3D spiral-in navigator echo for nonlinear motion-induced phase error correction. Any use of multishot k-space sampling in MRE also requires correction for motion induced phase errors. These phase errors come from erroneous motion encoded along with the desired MRE harmonic motion, and may arise from mechanical sources, like non-idealities in applied vibration, or physiological sources, like brain pulsation due to heartbeat.

In an embodiment, errors can be modeled as rigid body motions, i.e. the entire imaging volume moving spuriously as a rigid body. These errors could be considered as a set of linear rotations and translations, and thus correction for motion-induced phase error can include bulk phase differences and k-space trajectory shifts that result in signal loss and artifacts when shots are combined during image reconstruction. Acquisitions that utilize shots distributed throughout a 3D k-space may utilize an appropriate navigator acquisition to correct for trajectory shifts in $k_x$, $k_y$, and $k_z$. This type of linear motion induced phase error correction, could be achieved by the use of a low-resolution navigator image and associated algorithm.

However, the linear model does not consider errors due to deformations, such as is present from cardiac pulsation. Correction for these nonlinear errors requires an additional algorithm, as well as a higher resolution navigator. The higher resolution navigator ensures that the deformation patterns of interest in the error maps are sufficiently resolvable to be applied during correction. In an embodiment, a "spiral-in" navigator echo accompanies each shot. The spiral-in nature of the navigator ensures high signal due to it being sampled at the same echo time as the imaging data, and that higher signal is used to make a higher resolution image. Thus, the navigator also includes parallel imaging undersampling to minimize its total time and the effect on the imaging timing. If too long, it would unnecessarily extend the echo time and reduce the SNR.

In an embodiment, a 40×40×4 matrix is used for the navigator (compared to 120×120×4 for the imaging data), which is an effective resolution of 6×6×2 mm. Full sampling in the z direction is critical given the minimal z image sampling and the distributed nature of the slab. Using this navigator, the nonlinear motion induced phase error correction greatly improved image quality. The navigator removes the inter-slice phase discontinuities, which are a hallmark of phase error in MRE, and also improves the property maps by recovering anatomical features.

Figure 2:
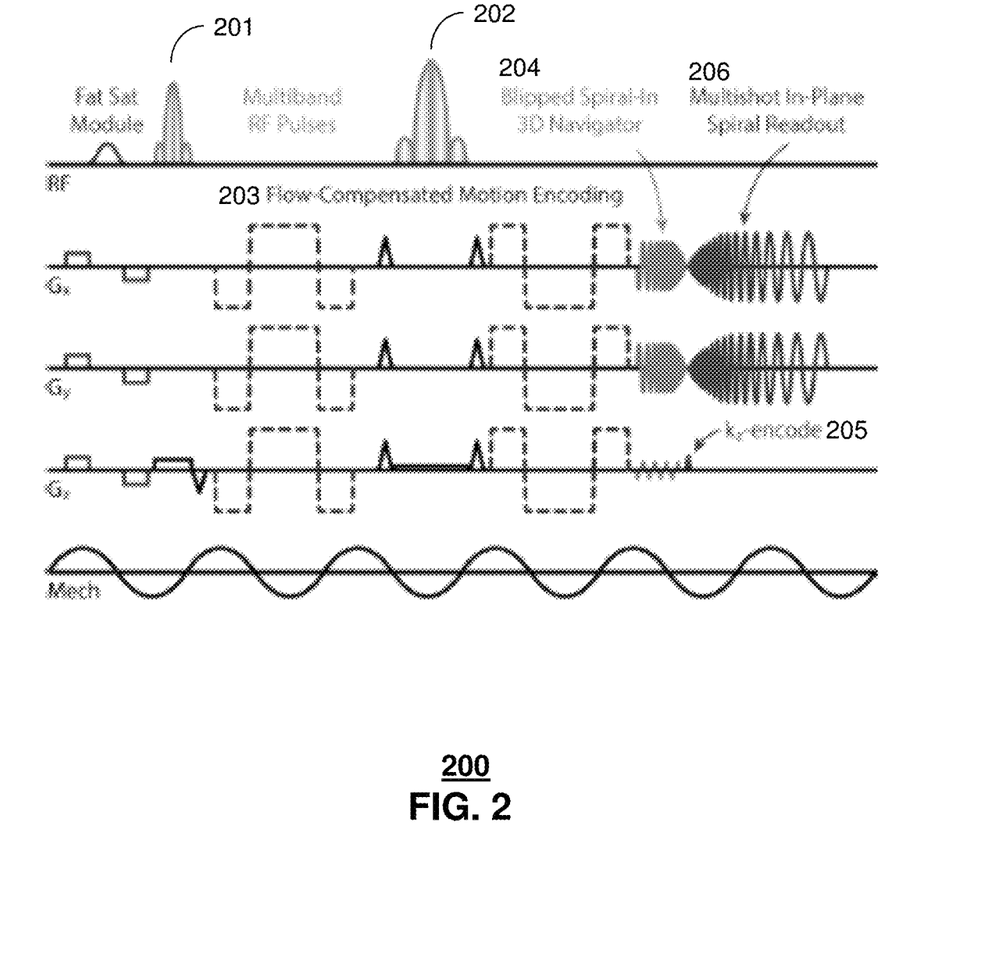
FIG. 2 depicts an illustrative embodiment of magnetic resonance elastography sequence for the system of FIG. 1.

FIG. 2 illustrates a pulse sequence diagram where motion-encoding gradients can be applied on either side of the refocusing pulse and a single, multiband k-space shot can be acquired in each excitation. The exemplary pulse sequence 200 represents a technical advancement relative to previous inventions through the use of the distributed slab volume. In one embodiment, multiband RF excitation 201 and refocusing 202 pulses, bilateral flow-compensated motion encoding gradients 203 separated by a single vibration period, and a blipped spiral-in 3D navigator 204 are applied before the echo time. In one embodiment, $k_z$-encoding gradient blips 205 can be provided before the in-plane spiral readouts 206 to define the sampled $k_z$ plane.

The multiband RF pulses 201, 202 excite and refocus multiple slices at once, each separated in the z-direction and with different phase to reduce peak RF power. The resulting volumes are excited in an interleaved fashion to cover the entire brain. Interleaving the excitation volumes provides access to optimal SNR efficiency due to its use of short TR.

The resulting volume is encoded with a 3D stack of spirals that includes multishot constant density spirals in-plane with $k_z$-blips. In one embodiment, the total number of excitations per volume can be equal to the number of in-plane interleaved spirals times the number of excited slices. Parallel imaging acceleration with sensitivity encoding (SENSE) is accomplished by undersampling both in-plane ($k_{xy}$) and through-plane ($k_z$) data.

A time efficient, 3D non-Cartesian navigator image of the distributed volume is acquired using a $k_z$-blipped spiral-in trajectory. The use of a navigator that fits into a small gap in the echo time before readout reduces acquisition time and RF energy deposition by removing a second refocusing pulse. Phase error maps for each shot are recovered by comparing with the mean of all navigator images for a given volume. Nonlinear correction is performed by applying the negative of these phase errors during iterative image reconstruction.

In one embodiment of an implementation of the 3D multiband, multishot acquisition methodology, MRE data was acquired with 2×2×2 mm$^3$ isotropic resolution using the proposed sequence using a Siemens 3T Trio with 32-channel head coil. The specific sequence parameters included: 4 band excitation; 60 total slices (15 volumes); 4 in-plane k-space readouts; FOV=240 mm; matrix=120×120; TR/TE=1800/75 ms. In an embodiment, the external wave generator 130 generated vibrations at 50 Hz using the Resoundant pneumatic actuator system and 4 phase offsets were acquired. Iterative image reconstruction included correction for field inhomogeneity distortions. The datasets were reconstructed with various undersampling patterns and with/without motion correction, and compared resulting OSS-SNR and shear stiffness maps from nonlinear inversion.

The exemplary pulse sequence 200 provides a 3D multiband, multishot MRE acquisition. Flow-compensated motion encoding gradients 203 are applied on either side of the refocusing pulse 202 and before the in-plane spiral readout gradients 204. The 3D k-space trajectory is a stack-of-spirals with $k_z$-encoding gradient blips 205 played before the spiral readout 206. Following a second flow-compensated motion encoding gradient, a low-resolution blipped spiral-in 3D navigator 204 is acquired as a single-shot stack-of-spirals for non-linear motion-induced phase error correction.

Figure 3:
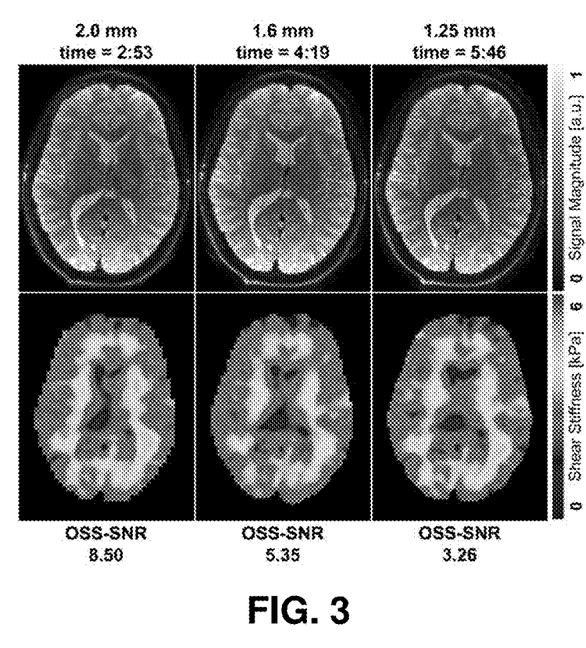
FIG. 3 illustrates three images of signal magnitude and shear stiffness acquired by the magnetic resonance elastography pulse sequence.

FIG. 3 illustrates three images of signal magnitude and shear stiffness acquired by the exemplary pulse sequence 200. In addition to the very fast 2 mm resolution described above, the parameters can be modified to achieve a higher resolution. In one embodiment, a 1.6 mm resolution can be acquired in 4:19 and a 1.25 mm resolution in 5:46, each having a high OSS-SNR. The resolutions can be controlled by modifying the in-plane sampling (number of spiral k-space shots) and thru-plane sampling (number of excited slices in our distributed slab). The modified parameters present a tradeoff between speed and resolution, with the objective data outcomes being data quality through OSS-SNR and field inhomogeneity artifact minimization. High-resolution data can thus be generated in clinically-acceptable scan times, or scale to ultra-resolution data suitable for cutting edge neuroscience research acquired during longer acquisitions.

Figure 4:
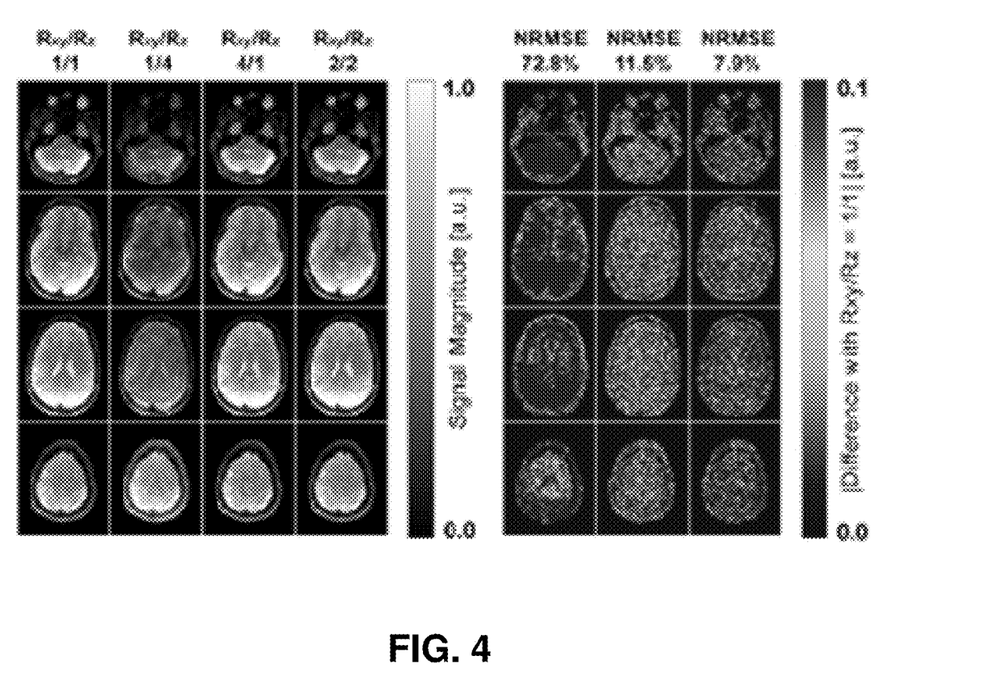
FIG. 4 illustrates images indicating tissue displacement magnitude from a single volume acquired through multiband MRE with fully sampled and undersampled acquisition techniques, and corresponding absolute difference maps between the fully sampled and undersampled images.

FIG. 4 illustrates images indicating tissue displacement magnitude from a single volume acquired through multiband MRE with fully sampled and undersampled acquisition techniques, and corresponding absolute difference maps between the fully sampled and undersampled images. As shown in FIG. 4, reconstructed images from a single volume are provided with fully sampled, in-plane, through-plane, or both undersampling patterns illustrated on the left side of the figure, and a comparison of undersampling with fully sampled images on the right side of the figure.

With a targeted total R of 4 (Rxy and Rz), three different configurations were compared to a fully sampled image, as shown in the first column on the left hand side of the diagram. In a first configuration illustrated in the second column, Rz=4, meaning only 1 out of 4 kz samples were acquired, and Rxy=1, meaning that every point in slice plane was acquired. The first configuration resulted in a very poor signal and high error relative to the fully sampled reference case. This result is expected given the very high undersampling in the z direction. In a second configuration, Rxy=4, meaning that 1 of every 4 xy samples were taken, and Rz=1. The results of this undersampling case look better, given the high density sampling in $k_z$, though with some visible residual aliasing artifacts and moderate normalized root mean square error (NRMSE). Finally, a mixed undersampling configuration was acquired in both directions, Rxy=2 and Rz=2, as shown in the fourth column. This configuration had no visible artifacts and a very low NRMSE. The 2/2 case, when processed all the way through to the final stiffness map, had very low error mostly concentrated at the ventricles. This is the highest undersampling achieved in an MRE acquisition.

Magnitude difference maps for each of the three undersampled images are illustrated on the right side of the figure. Areas of large differences compared to the fully sampled image due to residual aliasing and g-factor penalties are lowest in the two-direction undersampled case (Rxy/Rz=2/2) as compared to either in-plane or through-plane only. Notably, the 2/2 in-plane and through-plane undersampling case has the smallest NRMSE relative to fully-sampled image (Rxy/Rz=1/1). The ability to undersample in both directions allows for higher acceleration factors without the associated artifacts that may compromise MRE results.

Figure 5:
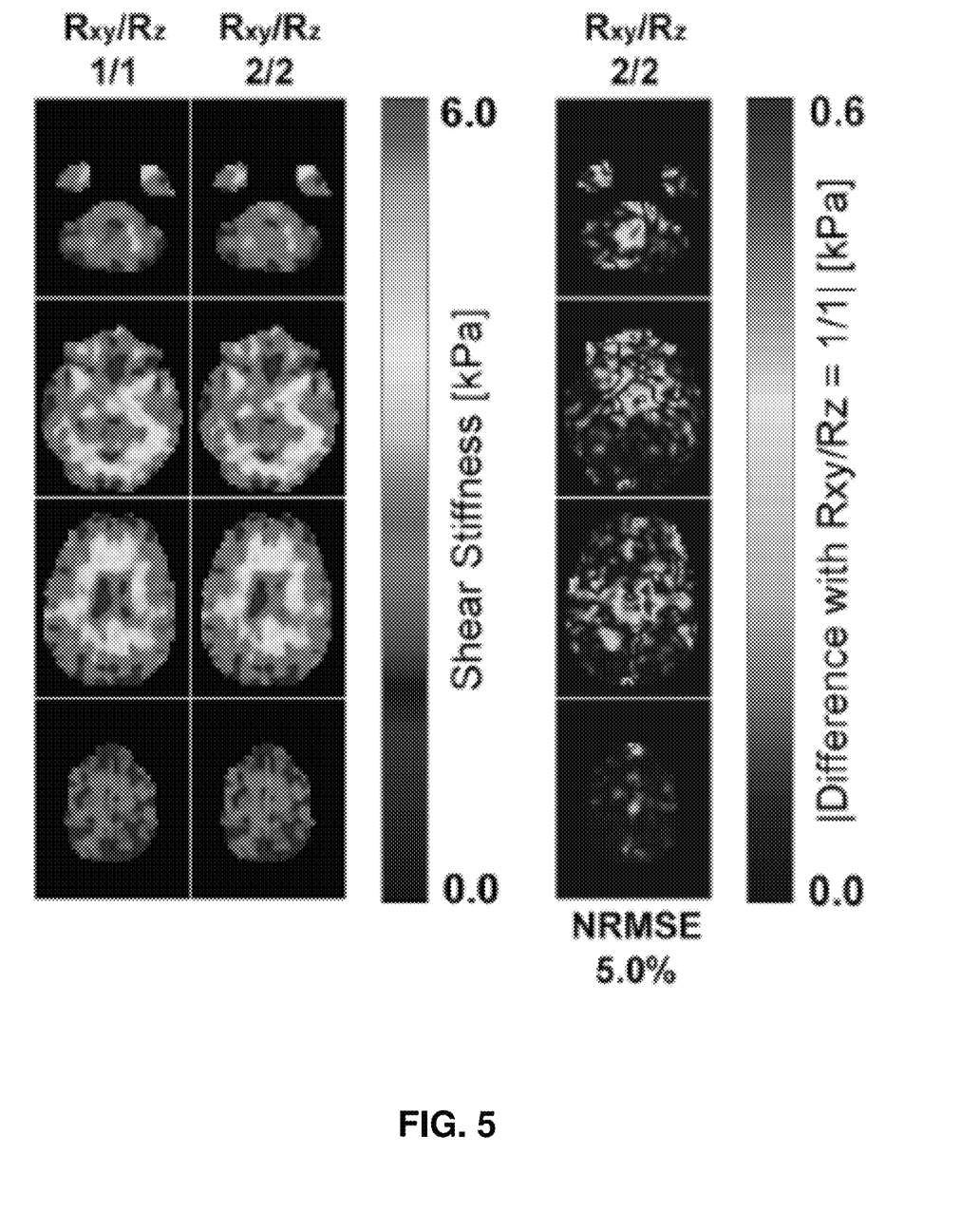
FIG. 5 illustrates images of tissue stiffness maps for a single volume acquired through multiband MRE with fully sampled and undersampled acquisition techniques and a corresponding absolute difference map.

FIG. 5 illustrates images of tissue stiffness maps for a single volume acquired through multiband MRE with fully sampled and two-direction undersampled acquisition techniques and a corresponding absolute difference map. The MRE results from the undersampled dataset compared with the fully-sampled case still maintains a high OSS-SNR for inversion stability (7.6) due to the SNR efficiency of the sequence. The resulting shear stiffness map is very similar to the fully-sampled case, with an NRMSE of only 5.0%, with the majority of error concentrated at ventricles, which are not valid regions for MRE analysis given their model-data mismatch.

Figure 6:
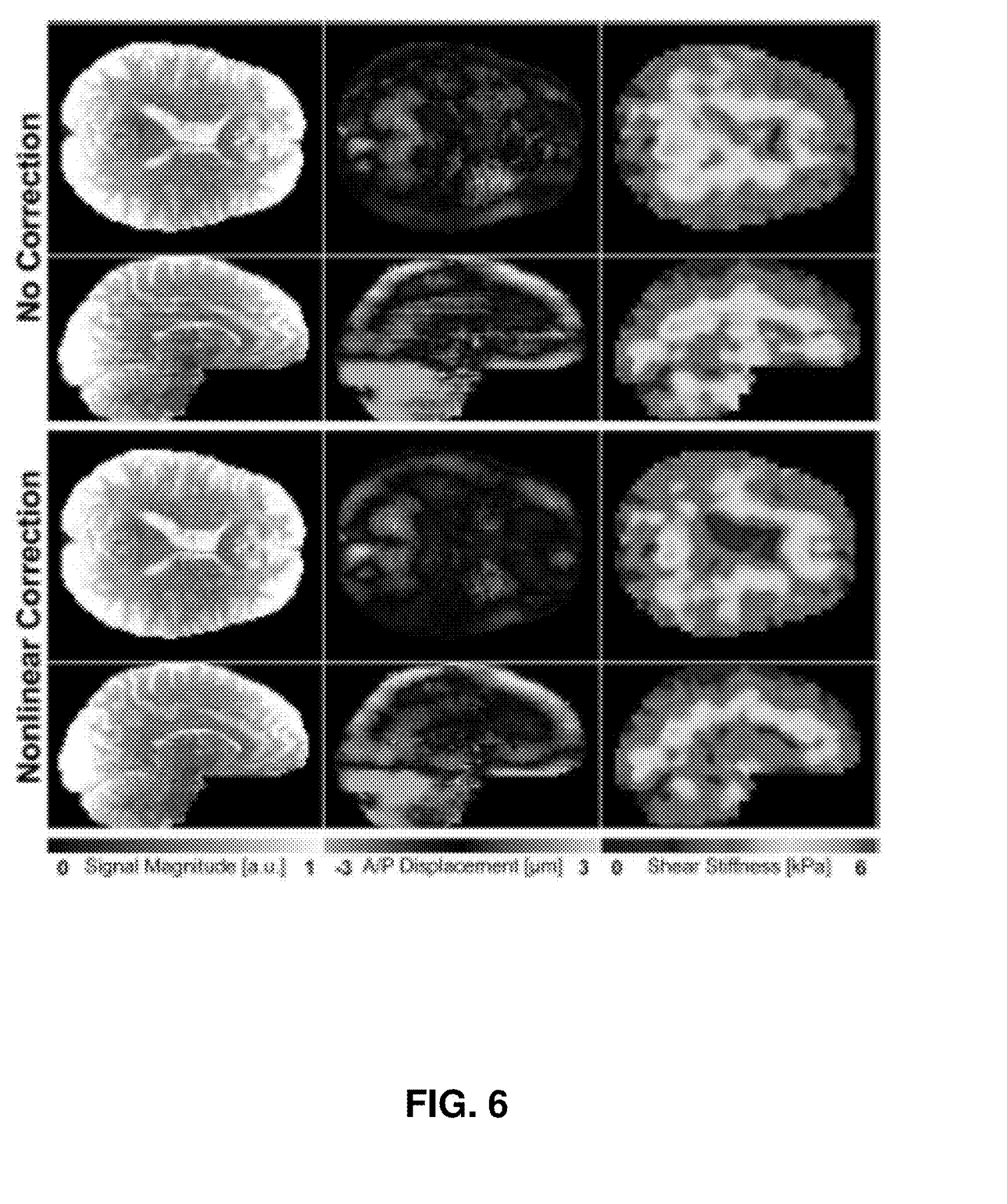
FIG. 6 illustrates images of tissue magnitude, displacement and shear stiffness with and without nonlinear motion correction.

FIG. 6 illustrates images of tissue magnitude, displacement and shear stiffness with and without nonlinear motion correction. Compared with magnitude images, complex displacement images, and shear stiffness maps from the uncorrected dataset, the corrected results exhibit clear improvement using the nonlinear motion correction. This is especially evident through an SNR improvement of 18% (OSS-SNR: 7.6 vs. 6.4) and corrected phase inconsistencies in the slice direction.

Figure 7:
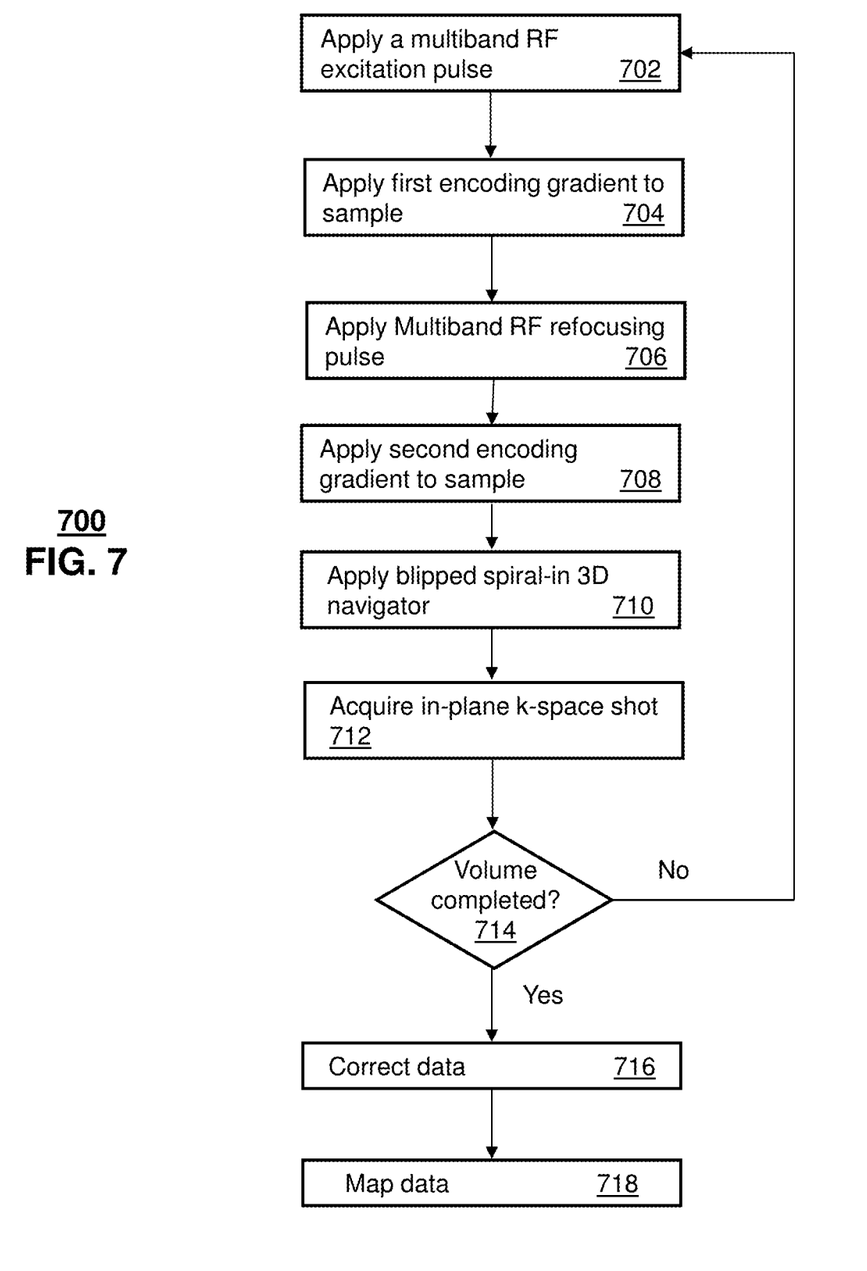
FIG. 7 depicts an illustrative embodiment of a method for performing a multiband, multishot magnetic resonance elastography acquisition.

FIG. 7 illustrates a method 700 for performing 3D multiband, multishot MRE acquisition on a sample, such as a brain in vivo, although the sample can be other human organs or other objects. The sample can be divided into a plurality of slabs that have a plurality of non-adjacent slices to facilitate the 3D data capture. At 702, a multiband RF excitation pulse is applied to excite a distributed set of slices. At 704, a first encoding gradient can be applied to the sample. The gradient can be a flow-compensated, motion encoding gradient. At 706, a multiband RF refocusing pulse can be applied to the sample. At 708, a second encoding gradient can be applied to the sample. The gradient can be flow-compensated.

At 710, a spiral-in 3D navigator can be acquired and a gradient blip can be provided to enable defining the sampled $k_z$ plane. For example, following a second refocusing pulse, a low-resolution 3D navigator can be acquired as a single shot stack-of-spirals for use in non-linear motion-induced phase error correction.

At 712, a single k-space shot can be acquired in each excitation resulting in a multishot in-plane spiral readout.

At 714, a determination is made as to whether the entire volume has been scanned. If more slabs having distributed slice need to be scanned, then method 700 returns to 702 to apply encoding gradients and acquire additional k-space shots. If the entire volume has been scanned then at 716, the navigator(s) can be used for non-linear motion-induced phase error correction.

The corrected data can then be used in generating modulus map images or other representations of the data at 718. The exemplary embodiments can include other techniques to be utilized with respect to the capturing of the k-space data and/or with respect to the correction of the k-space data, such as described in U.S. Patent Publication 2013/0181712 to Sutton, and/or as described in U.S. application Ser. No. 14/178,355 filed Feb. 12, 2014, the disclosures of which are hereby incorporated by reference in their entirety. In one embodiment, some or all of the navigators are averaged and a difference between each individual navigator (associated with a single shot) and the averaged navigators (across multiple shots) is considered as the error to be corrected. Here the averaged navigators serves as a reference for the entire volume of the sample. In an embodiment, all of the navigators from each shot are averaged together to find the mean navigator. Then the phase error is identified by comparing each navigator to this mean. All navigators (and their associated imaging data) are then corrected to the mean. In another embodiment, one navigator can be designated as a reference navigator and all other navigators and imaging data can be corrected to the reference navigator. The phase error would be identified between each navigator and the reference navigator, then all the navigators and their associated imaging data are corrected for the phase error.

Figure 8:
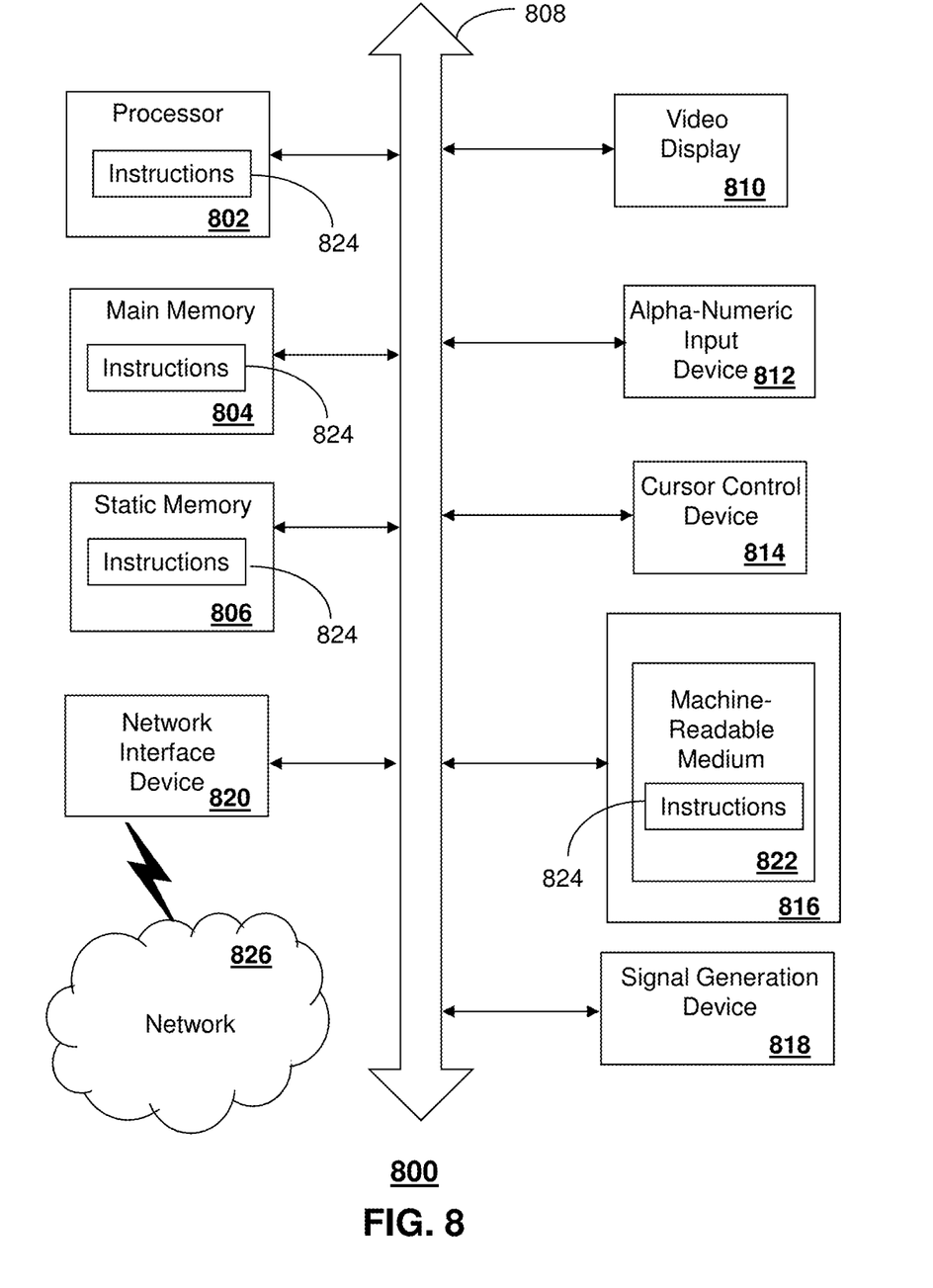
FIG. 8 is a diagrammatic representation of a machine in the form of a computer system within which a set of instructions, when executed, may cause the machine to perform any one or more of the methods described herein.

FIG. 8 depicts an exemplary diagrammatic representation of a machine in the form of a computer system 800 within which a set of instructions, when executed, may cause the machine to perform any one or more of the methods described above. One or more instances of the machine can operate, for example, as the gradient control module 116, the external wave generator 130, and the computer 140. In some embodiments, the machine may be connected (e.g., using a network 826) to other machines. In a networked deployment, the machine may operate in the capacity of a server or a client user machine in a server-client user network environment, or as a peer machine in a peer-to-peer (or distributed) network environment.

The machine may comprise a server computer, a client user computer, a personal computer (PC), a tablet, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 800 may include a processor (or controller) 802 (e.g., a central processing unit (CPU)), a graphics processing unit (GPU, or both), a main memory 804 and a static memory 806, which communicate with each other via a bus 808. The computer system 800 may further include a display unit 810 (e.g., a liquid crystal display (LCD), a flat panel, or a solid state display). The computer system 800 may include an input device 812 (e.g., a keyboard), a cursor control device 814 (e.g., a mouse), a disk drive unit 816, a signal generation device 818 (e.g., a speaker or remote control) and a network interface device 820. In distributed environments, the embodiments described in the subject disclosure can be adapted to utilize multiple display units 810 controlled by two or more computer systems 800. In this configuration, presentations described by the subject disclosure may in part be shown in a first of the display units 810, while the remaining portion is presented in a second of the display units 810.

The disk drive unit 816 may include a tangible computer-readable storage medium 822 on which is stored one or more sets of instructions (e.g., software 824) embodying any one or more of the methods or functions described herein, including those methods illustrated above. The instructions 824 may also reside, completely or at least partially, within the main memory 804, the static memory 806, and/or within the processor 802 during execution thereof by the computer system 800. The main memory 804 and the processor 802 also may constitute tangible computer-readable storage media.

Dedicated hardware implementations including, but not limited to, application specific integrated circuits, programmable logic arrays and other hardware devices can likewise be constructed to implement the methods described herein. Application specific integrated circuits and programmable logic array can use downloadable instructions for executing state machines and/or circuit configurations to implement embodiments of the subject disclosure. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the operations or methods described herein are intended for operation as software programs or instructions running on or executed by a computer processor or other computing device, and which may include other forms of instructions manifested as a state machine implemented with logic components in an application specific integrated circuit or field programmable gate array. Furthermore, software implementations (e.g., software programs, instructions, etc.) including, but not limited to, distributed processing or component/object distributed processing, parallel processing, or virtual machine processing can also be constructed to implement the methods described herein. It is further noted that a computing device such as a processor, a controller, a state machine or other suitable device for executing instructions to perform operations or methods may perform such operations directly or indirectly by way of one or more intermediate devices directed by the computing device.

While the tangible computer-readable storage medium 822 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure. The term "non-transitory" as in a non-transitory computer-readable storage includes without limitation memories, drives, devices and anything tangible but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML and HTTP) represent examples of the state of the art. Such standards are from time-to-time superseded by faster or more efficient equivalents having essentially the same functions. Wireless standards for device detection (e.g., RFID), short-range communications (e.g., Bluetooth®, WiFi, ZigBee®), and long-range communications (e.g., WiMAX, GSM, CDMA, LTE) can be used by computer system 800.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. The exemplary embodiments can include combinations of features and/or steps from multiple embodiments. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure. In one or more embodiments, features that are positively recited can also be excluded from the embodiment with or without replacement by another component or step. The steps or functions described with respect to the exemplary processes or methods can be performed in any order. The steps or functions described with respect to the exemplary processes or methods can be performed alone or in combination with other steps or functions (from other embodiments or from other steps that have not been described).

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can be used in supporting a virtual processing environment. The virtual processing environment may support one or more virtual machines representing computers, servers, or other computing devices. In such virtual machines, components such as microprocessors and storage devices may be virtualized or logically represented. The processor can include a state machine, application specific integrated circuit, and/or programmable gate array including a Field PGA. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method of magnetic resonance elastography, the method comprising:
    applying, by a system including a processor, a multiband radio frequency (RF) excitation pulse to a sample, wherein the sample is divided into a plurality of slabs that each include a plurality of non-adjacent slices;
    applying, by the system, first and second motion encoding gradients and a multiband RF refocusing pulse to the sample, wherein the first motion encoding gradient is applied before the multiband RF refocusing pulse, and wherein the second motion encoding gradient is applied after the multiband RF refocusing pulse;
    acquiring, by the system, a blipped, spiral-in three dimensional navigator data;
    providing, by the system, a gradient blip normal to the non-adjacent slices to define a sample plane;
    acquiring, by the system, in-plane k-space data after the second motion encoding gradient is applied and after the gradient blip is provided; and
    repeating the applying of the multiband RF excitation pulse, the applying of the first and second motion encoding gradients and the multiband RF refocusing pulse, and the acquiring of the in-plane k-space data over the plurality of slabs to obtain three dimensional multiband, multishot data.

2. The method of claim 1, comprising generating a modulus map image for the sample according to the three dimensional multiband, multishot data.

3. The method of claim 1, comprising:
    determining a relaxation time for the sample; and
    calculating a repetition time according to the relaxation time, wherein the three dimensional multiband, multishot data is obtained according to the repetition time.

4. The method of claim 1, comprising:
    performing, by the system, non-linear motion correction for phase errors, the non-linear motion correction being performed based on the spiral-in three dimensional navigator data.

5. The method of claim 4, wherein the acquiring of the spiral-in three dimensional navigator data is repeated over the plurality of slabs of the sample to acquire a plurality of navigators, wherein the non-linear motion correction is performed based on the plurality of navigators.

6. The method of claim 5, comprising:
    averaging the plurality of navigators, wherein the non-linear motion correction for the phase errors is performed based on phase errors determined by comparing each navigator with an average of the plurality of navigators.

7. The method of claim 1, wherein a total number of excitations is equal to a number of acquired in-plane k-space shots times a number of slices per slab, and wherein the first and second motion encoding gradients are flow-compensated.

8. The method of claim 1, wherein the three dimensional multiband, multishot data is obtained utilizing parallel imaging by undersampling.

9. The method of claim 8, wherein the undersampling comprises in-plane undersampling and through-plane undersampling.

10. The method of claim 1, wherein the sample is an in vivo brain, wherein the plurality of non-adjacent slices of consecutive slabs are interleaved.

11. A system comprising:
an actuator for applying a vibration to a sample;
a magnetic resonance system for facilitating applying magnetic resonance elastography to the sample;
a processor coupled with the actuator and the magnetic resonance system; and
a memory that stores executable instructions which, responsive to being executed by the processor, facilitate performance of operations, comprising:
applying first and second motion encoding gradients and a multiband radio frequency (RF) excitation pulse to the sample, wherein the multiband RF excitation pulse is applied before the first motion encoding gradient, and wherein the second motion encoding gradient is applied after a multiband RF refocusing pulse;
acquiring a blipped, spiral-in three dimensional navigator data;
providing a gradient blip to define a sample plane;
acquiring in-plane k-space data after the gradient blip is provided; and
repeating the applying of the multiband RF excitation pulse, the first and second motion encoding gradients, the multiband RF refocusing pulse and the acquiring of the in-plane k-space data over a plurality of slabs comprising non-adjacent slices to obtain three dimensional multiband, multishot data.

12. The system of claim 11, wherein the operations further comprise generating a modulus map image for the sample according to the three dimensional multiband, multishot data.

13. The system of claim 11, wherein the operations further comprise performing non-linear motion correction for phase errors, the non-linear motion correction being performed based on the spiral-in three dimensional navigator data.

14. The system of claim 11, wherein the three dimensional multiband, multishot data is obtained utilizing parallel imaging by in-plane and through-plane undersampling.

15. The system of claim 11, wherein the non-adjacent slices of consecutive slabs are interleaved.

16. A computer-readable storage device comprising computer instructions which, responsive to being executed by a processor, facilitate performance of operations, comprising:
applying a multiband radio frequency (RF) excitation pulse to a sample that is divided into a plurality of slabs that each include a plurality of non-adjacent slices;
applying first and second motion encoding gradients and a multiband RF refocusing pulse to the sample, wherein the first motion encoding gradient is applied before the multiband RF refocusing pulse and the second motion encoding gradient is applied after the multiband RF refocusing pulse;
acquiring a blipped, spiral-in three dimensional navigator data;
providing an encoded gradient blip to define a sample plane;
acquiring an in-plane k-space shot comprising the plurality of non-adjacent slices after the second motion encoding gradient is applied; and
repeating the applying of the multiband RF excitation pulse, the applying of the first and second motion encoding gradients and the multiband RF refocusing pulse, and the acquiring of the spiral-in three dimensional navigator data and the in-plane k-space shot over the plurality of slabs of the sample to obtain three dimensional multiband, multishot data.

17. The computer-readable storage device of claim 16, wherein the operations further comprise:
determining a relaxation time for the sample; and
calculating a repetition time according to the relaxation time to achieve a high signal-to-noise ratio efficiency, wherein the three dimensional multiband, multishot data is obtained according to the repetition time.

18. The computer-readable storage device of claim 16, wherein the operations further comprise: correcting for non-linear motion phase errors based on the blipped, spiral-in three dimensional navigator data acquired.

19. The computer-readable storage device of claim 16, wherein the plurality of non-adjacent slices between consecutive slabs are interleaved.

20. The computer-readable storage device of claim 16, wherein the three dimensional multiband, multishot data is obtained utilizing parallel imaging of the sample by in-plane and through-plane undersampling.

* * * * *